(12) United States Patent
Hagiwara et al.

(10) Patent No.: US 7,242,268 B2
(45) Date of Patent: Jul. 10, 2007

(54) UNBALANCED-BALANCED MULTIBAND FILTER MODULE

(75) Inventors: Kazuhiro Hagiwara, Saitama-ken (JP); Shigeru Kemmochi, Saitama-ken (JP); Keisuke Fukamachi, Saitama-ken (JP); Mitsuhiro Watanabe, Meerbusch (DE); Tsuyoshi Taketa, Tottori-ken (JP); Yoshiyuki Murakami, Tottori-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 99 days.

(21) Appl. No.: 10/532,239

(22) PCT Filed: Oct. 27, 2003

(86) PCT No.: PCT/JP03/13718

§ 371 (c)(1),
(2), (4) Date: Apr. 22, 2005

(87) PCT Pub. No.: WO2004/038913

PCT Pub. Date: May 6, 2004

(65) Prior Publication Data

US 2006/0044080 A1    Mar. 2, 2006

(30) Foreign Application Priority Data

Oct. 25, 2002  (JP) .............................. 2002-310876

(51) Int. Cl.
*H03H 9/70* (2006.01)
*H03H 9/72* (2006.01)
*H01P 1/213* (2006.01)
*H04B 1/44* (2006.01)

(52) U.S. Cl. ...................... 333/133; 333/103; 333/134; 333/193; 333/189; 455/83; 455/78

(58) Field of Classification Search ................ 333/133, 333/193
See application file for complete search history.

(56) References Cited

U.S. PATENT DOCUMENTS 6,115,592 A * 9/2000 Ueda et al. .................. 455/307

(Continued)

FOREIGN PATENT DOCUMENTS

JP  51-7793  * 3/1976

OTHER PUBLICATIONS

International Search Report dated Feb. 10, 2004.

*Primary Examiner*—Barbara Summons
(74) *Attorney, Agent, or Firm*—Sughrue Mion, PLLC

(57) ABSTRACT

An unbalanced-balanced multiband filter module comprising three high-frequency switches each comprising a switching element, and two unbalanced-balanced bandpass filters having different transmitting frequency bands, a first high-frequency switch being connected to an unbalanced port of the module, an unbalanced port of the first unbalanced-balanced bandpass filter, and an unbalanced port of the second unbalanced-balanced bandpass filter; a second high-frequency switch being connected to a first balanced port of the module, a first balanced port of the first unbalanced-balanced bandpass filter, and a first balanced port of the second unbalanced-balanced bandpass filter; a third high-frequency switch being connected to a second balanced port of the module, a second balanced port of the first unbalanced-balanced bandpass filter, and a second balanced port of the second unbalanced-balanced bandpass filter; and the first to third high-frequency switches being switched depending on a passing high-frequency signal, whereby a high-frequency signal input into an unbalanced port of the module is output from the first and second balanced ports, or a high-frequency signal input into the first and second balanced ports is output from an unbalanced port of the module.

14 Claims, 10 Drawing Sheets

U.S. PATENT DOCUMENTS

| | | | |
|---|---|---|---|
| 6,483,399 B1 * | 11/2002 | Atokawa | 333/133 |
| 6,606,015 B2 * | 8/2003 | Uriu et al. | 333/132 |
| 6,606,016 B2 * | 8/2003 | Takamine | 333/133 |
| 6,713,940 B2 * | 3/2004 | Takamine | 310/313 R |
| 6,861,924 B2 * | 3/2005 | Machui | 333/133 |
| 6,914,477 B2 * | 7/2005 | Shibahara | 327/558 |
| 7,010,273 B2 * | 3/2006 | Satoh et al. | 455/83 |

FOREIGN PATENT DOCUMENTS

| | | | |
|---|---|---|---|
| JP | 8-321738 A | | 12/1996 |
| JP | 10-79601 A | | 3/1998 |
| JP | 11-144961 A | | 5/1999 |
| JP | 2001-60839 A | | 3/2001 |
| JP | 2001-160766 | * | 6/2001 |
| JP | 2001-203601 A | | 7/2001 |
| JP | 2001-345729 A | | 12/2001 |
| JP | 2002-171187 A | | 6/2002 |
| JP | 2002-280926 A | | 9/2002 |
| JP | 2002-304178 A | | 10/2002 |
| JP | 2002-314371 A | | 10/2002 |
| JP | 2003-87150 | * | 3/2003 |
| JP | 2003-283296 A | | 10/2003 |

* cited by examiner

UNBALANCED-BALANCED MULTIBAND FILTER MODULE

FIELD OF THE INVENTION

The present invention relates to a balanced-unbalanced multiband filter module usable for high-frequency circuits in multiband communications devices such as mobile phones, etc. that can be used in different access systems.

BACKGROUND OF THE INVENTION

There are various access systems in mobile phones in the world, and pluralities of access systems are simultaneously used in the same areas. One of the access systems mainly used at present is, for instance, a TDMA (time division multiple access) system. Main communications systems using this TDMA system include PDC (personal digital cellular) in Japan, GSM (global system for mobile communications) and DCS1800 (digital cellular system 1800) mainly used in Europe, PCS (personal communications service) mainly used in the U.S., etc.

Another access system that has recently become popular in the U.S., Korea and Japan is a CDMA (code division multiple access) system. IS-95 (interim standard-95) is mainly used in the U.S. as a typical standard in the frequency band of PCS (personal communications service). In addition, W-CDMA (wideband CDMA), a third-generation communications system, which can achieve high-speed data transmission, has been put into practical use. Various communications systems are thus utilized in countries in the world.

Conventional mobile phones are designed for one communications system, for instance, GSM. However, because of recent increase in the number of users and for the convenience of users, pluralities of communications or access systems applicable to dual-band or triple-band mobile phones were proposed, and there is also demand to quatro-band mobile phones. If high-frequency parts were simply mounted in every communications systems in the high-frequency circuits of such multiband mobile phones, the high-frequency circuits would be inevitably large. For miniaturization, common high-frequency parts have been used more and more in different communications systems. One example thereof is a diplexer circuit comprising a common high-frequency part for different communications systems. For instance, JP 8-321738 A discloses a two-frequency diplexer 250 having passbands of 950 MHz and 1.9 GHz, which comprises bandpass filters 20a, 20b and phase shifters 40a, 40b, 70a, 70b, as shown in the equivalent circuit of FIG. 20.

However, it has been found that the use of such high-frequency parts for the high-frequency circuits of multiband mobile phones causes several problems. A high-frequency circuit for a multiband mobile phone is constituted by conventional high-frequency parts 250 in a transmitting circuit and a receiving circuit, as shown in FIG. 21. FIG. 21 shows a high-frequency circuit for a dual-band mobile phone applicable to two communications systems of GSM850 (transmitting frequency: 824-849 MHz, receiving frequency: 869-894 MHz) and GSM900 (transmitting frequency: 880-915 MHz, receiving frequency: 925-960 MHz).

To reduce a noise index and increase a receiving sensitivity, the receiving circuit comprises balanced high-frequency parts (low-noise amplifier 266, mixer 268, etc.) comprising two signal lines. Accordingly, the connection of said high-frequency parts to a low-noise amplifier needs a balanced-to-unbalanced transformer. In addition, the input impedance of said low-noise amplifier 266 is set at about 50 to 300 Ω, needing an impedance conversion circuit. It is thus considered to use balanced-to-unbalanced transformers (baluns) 262, 263 as circuit elements having the functions of a balanced-to-unbalanced transformer and an impedance conversion circuit. However, this increases the number of circuit elements in the high-frequency circuit, and an insertion loss of about 1 dB is added from the balun in a frequency band of the operating high-frequency signal. As a result, to obtain a desired gain in the low-noise amplifier 266, an excess bias current should be added to the amplifying element, resulting in increase in the battery consumption of mobile phones.

In a high-frequency circuit of a TDMA system, the switching of connection between an antenna 269 and transmitting/receiving circuits is generally conducted by a switch circuit 264. In this switch circuit 264, GaAs FETs and diodes are used as switching elements. In such switch circuit, a high-frequency signal leaks to the level of about 20-30 dB (isolation) between the transmitting circuit and the receiving circuit. Accordingly, there is the leak of a high-frequency signal to the other circuits, if slightly.

For instance, when extremely close frequency bands are used in different communications systems, for instance, of GSM850 and GSM900, or DCS1800 and PCS, a receiving frequency band and a passband partially overlap as shown in FIG. 22. When communications are carried out by GSM900, part of the high-frequency signal is leaked from the transmitting circuit to the receiving circuit via a switch circuit, and input into the low-noise amplifier 266 via a bandpass filter 252 handling the receiving signal of GSM850. Also, when communications are carried out by GSM850, the receiving signal of GSM850 from the antenna is input into the amplifier 265 via a bandpass filter 251 handling the transmitting signal of GSM900. In any case, the communications quality is deteriorated.

OBJECTS OF THE INVENTION

Accordingly, the first object of the present invention is to provide a balanced-unbalanced multiband filter module applicable to pluralities of communications systems and access systems, with suppressed increase in insertion loss.

The second object of the present invention is to provide a balanced-unbalanced multiband filter module, which in a multiband mobile phone of communications or access systems using extremely close frequency bands, permits a high-frequency signal in the operating communications or access system to pass while cutting a high-frequency signal in the other communications or access system.

The third object of the present invention is to provide a small high-frequency part comprising such a balanced-unbalanced multiband filter module.

The fourth object of the present invention is to provide a multiband mobile phone comprising such a balanced-unbalanced multiband filter module.

DISCLOSURE OF THE INVENTION

The first balanced-unbalanced multiband filter module of the present invention comprises three high-frequency switches each comprising a switching element, and two balanced-unbalanced bandpass filters having different passbands, a first high-frequency switch comprising a first port connected to an unbalanced port of said module, a second port connected to an unbalanced port of a first balanced-unbalanced bandpass filter, and a third port connected to an unbalanced port of a second balanced-unbalanced bandpass filter;

a second high-frequency switch comprising a first port connected to a first balanced port of said module, a second port connected to a first balanced port of the first balanced-unbalanced bandpass filter, and a third port connected to a first balanced port of the second balanced-unbalanced bandpass filter;

a third high-frequency switch comprising a first port connected to a second balanced port of said module, a second port connected to a second balanced port of the first balanced-unbalanced bandpass filter, and a third port connected to a second balanced port of the second balanced-unbalanced bandpass filter;

said first to third high-frequency switches being switched depending on a passing high-frequency signal, whereby a high-frequency signal input into the unbalanced port of said module is output from the first and second balanced ports, or high-frequency signals input into said first and second balanced ports are output from the unbalanced port of said module.

The second balanced-unbalanced multiband filter module of the present invention comprises two balanced-unbalanced bandpass filters having different passbands, and six phase shifters connected to said balanced-unbalanced bandpass filters, a first phase shifter comprising a first port connected to an unbalanced port of said module, and a second port connected to an unbalanced port of a first balanced-unbalanced bandpass filter;

a second phase shifter comprising a first port connected to the unbalanced port of said module, and a second port connected to an unbalanced port of a second balanced-unbalanced bandpass filter;

a third phase shifter comprising a first port connected to a first balanced port of a first balanced-unbalanced bandpass filter, and a second port connected to a first balanced port of said module;

a fourth phase shifter comprising a first port connected to a second balanced port of the first balanced-unbalanced bandpass filter, and a second port connected to a second balanced port of said module;

a fifth phase shifter comprising a first port connected to a first balanced port of the second balanced-unbalanced bandpass filter, and a second port connected to the first balanced port of said module; and a sixth phase shifter comprising a first port connected to a second balanced port of the second balanced-unbalanced bandpass filter, and a second port connected to the second balanced port of said module;

whereby a high-frequency signal input into the unbalanced port of said module is output from said first and second balanced ports, or high-frequency signals input into said first and second balanced ports are output from the unbalanced port of said module.

In the second balanced-unbalanced multiband filter module, the first, third and fourth phase shifters are connected to the first balanced-unbalanced bandpass filter, and impedance is high in the passband of the second balanced-unbalanced bandpass filter when the first balanced-unbalanced bandpass filter is viewed from the unbalanced port or the first and second balanced ports of the module. The second, fifth and sixth phase shifters are connected to the second balanced-unbalanced bandpass filter, and impedance is high in the passband of the first balanced-unbalanced bandpass filter when the second balanced-unbalanced bandpass filter is viewed from the unbalanced port or the first and second balanced ports of the module.

The role of the phase shifters in the present invention is as follows: FIG. 19(a) is a Smith chart showing one example of impedance characteristics when viewed from the balanced ports of the balanced-unbalanced bandpass filter, and FIG. 19(b) is a Smith chart showing one example of impedance characteristics when viewed from the unbalanced port of the balanced-unbalanced bandpass filter. This balanced-unbalanced bandpass filter is a SAW filter, whose passband is GSM850. Triangular markers in the figure represent frequencies, markers 1-4 being 869 MHz, 894 MHz, 925 MHz, and 960 MHz, respectively. Between the markers 1, 2 is a receiving frequency band of GSM850, and between the markers 3, 4 is a receiving frequency band of GSM900.

The impedance of the balanced port is substantially 50 Ω in a receiving frequency band of GSM850, and substantially in an open range (high impedance) in a receiving frequency band of GSM900. The impedance of the unbalanced port is substantially 50 Ω in a receiving frequency band of GSM850, and substantially outside the open range in a receiving frequency band of GSM900. The term "substantially open range" means a range, in which when the impedance Z is expressed by $Z=R+jX$, a real part R is 150 Ω or more, or an imaginary part X is 100 Ω or more in an absolute value. In the Smith charts of FIGS. 19(a) and 19(b), hatched portions on the right side are substantially open ranges.

With two balanced-unbalanced bandpass filters having such impedance characteristics (one is a SAW filter having a passband of GSM850, and the other is a SAW filter having a passband of GSM900), because the impedance of a balanced port of the SAW filter having a passband of GSM850 is substantially in an open range in a receiving frequency band of GSM900, a high-frequency signal in the receiving frequency band of GSM900 is not substantially or only little, if any, absorbed by the SAW filter having the passband of GSM850. On the other hand, because the impedance of an unbalanced port is outside the substantially open range in the receiving frequency band of GSM900, part of a high-frequency signal in the receiving frequency band of GSM900 is absorbed by the SAW filter having the passband of GSM850, resulting in the deterioration of insertion loss characteristics. Thus, the phase shifters perform phase adjustment such that the impedance of the unbalanced port is in a substantially open state.

The phase shifters are constituted by transmission lines having such line length as to provide a substantially open state (high impedance), or lowpass or highpass filters comprising inductance elements and capacitance elements. When the inductance element of the lowpass filter is constituted by a transmission line, the line length of the phase shifter is preferably shorter than when the phase shifter is constituted only by transmission lines.

Such a structure makes it possible to prevent a high-frequency signal that should pass the first balanced-unbalanced bandpass filter from leaking to the second balanced-unbalanced bandpass filter, and a high-frequency signal that should pass the second balanced-unbalanced bandpass filter from leaking to the first balanced-unbalanced bandpass filter, resulting in high isolation characteristics with no deterioration of insertion loss characteristics.

The third balanced-unbalanced multiband filter module of the present invention comprises a high-frequency switch comprising a switching element, two balanced-unbalanced bandpass filters having different passbands, and four phase shifters connected to said balanced-unbalanced bandpass filters, said high-frequency switch comprising a first port connected to an unbalanced port of said module, a second port connected to an unbalanced port of a first balanced-unbalanced bandpass filter, and a third port connected to an unbalanced port of a second balanced-unbalanced bandpass filter;

a first phase shifter comprising a first port connected to a first balanced port of the first balanced-unbalanced bandpass filter, and a second port connected to a first balanced port of said module;

a second phase shifter comprising a first port connected to a second balanced port of the first balanced-unbalanced bandpass filter, and a second port connected to a second balanced port of said module;

a third phase shifter comprising a first port connected to a first balanced port of the second balanced-unbalanced bandpass filter, and a second port connected to the first balanced port of said module; and a fourth phase shifter comprising a first port connected to a second balanced port of the second balanced-unbalanced bandpass filter, and a second port connected to the second balanced port of said module;

said first high-frequency switch being switched depending on a passing high-frequency signal, whereby a high-frequency signal input into the unbalanced port of said module is output from the first and second balanced ports, or high-frequency signals input into said first and second balanced ports are output from the unbalanced port of said module.

In the third balanced-unbalanced multiband filter module, the first and second phase shifters are connected to the first balanced-unbalanced bandpass filter, and constituted by transmission lines having such length that impedance is high in the passband of the second balanced-unbalanced bandpass filter when the first balanced-unbalanced bandpass filter is viewed from the first and second balanced ports of the balanced-unbalanced multiband filter module. Alternatively, the first and second phase shifters may be constituted by lowpass or highpass filters comprising inductance elements and capacitance elements. The third and fourth phase shifters are connected to the second balanced-unbalanced bandpass filter, and constituted by transmission lines having such length that impedance is high in the passband of the first balanced-unbalanced bandpass filter when the second balanced-unbalanced bandpass filter is viewed from the first and second balanced ports of the balanced-unbalanced multiband filter module. Alternatively, like the first and second phase shifters, the third and fourth phase shifters may be constituted by lowpass or highpass filters having inductance elements and capacitance elements.

The fourth balanced-unbalanced multiband filter module of the present invention comprises two high-frequency switches each comprising a switching element, two balanced-unbalanced bandpass filters having different passbands, and two phase shifters connected to said balanced-unbalanced bandpass filters, a first phase shifter comprising a first port connected to an unbalanced port of said module, and a second port connected to an unbalanced port of a first balanced-unbalanced bandpass filter;

a second phase shifter comprising a first port connected to the unbalanced port of said module, and a second port connected to an unbalanced port of a second balanced-unbalanced bandpass filter;

a first high-frequency switch comprising a first port connected to the first balanced port of said module, a second port connected to the first balanced port of the first balanced-unbalanced bandpass filter, and a third port connected to the first balanced port of the second balanced-unbalanced bandpass filter; and a second high-frequency switch comprising a first port connected to a second balanced port of said module, a second port connected to a second balanced port of the first balanced-unbalanced bandpass filter, and a third port connected to a second balanced port of the second balanced-unbalanced bandpass filter;

said first and second high-frequency switches being switched depending on a passing high-frequency signal, whereby a high-frequency signal input into the unbalanced port of said module is output from the first and second balanced ports, or high-frequency signals input into said first and second balanced ports are output from the unbalanced port of said module.

In the fourth balanced-unbalanced multiband filter module, the first phase shifter is connected to the first balanced-unbalanced bandpass filter, and constituted by transmission lines having such length that impedance is high in the passband of the second balanced-unbalanced bandpass filter when the first balanced-unbalanced bandpass filter is viewed from the unbalanced port of the balanced-unbalanced multiband filter module. Alternatively, the first phase shifter may be constituted by lowpass or highpass filters having inductance elements and capacitance elements. The second phase shifter is connected to the second balanced-unbalanced bandpass filter, and constituted by transmission lines having such length that impedance is high in the passband of the first balanced-unbalanced bandpass filter when the second balanced-unbalanced bandpass filter is viewed from the unbalanced port of the balanced-unbalanced multiband filter module. Alternatively, like the first phase shifter, the second phase shifter may be constituted by lowpass or highpass filters having inductance elements and capacitance elements.

In the first to fourth balanced-unbalanced multiband filter modules, the first and second balanced-unbalanced bandpass filters preferably have different input impedance $Zi$ and output impedance $Zo$ to exhibit an impedance conversion function. When the unbalanced port is used as an input port, and when the balanced port is used as an output port, the output impedance $Zo$ is preferably larger than the input impedance $Zi$. On the other hand, when the unbalanced port is used as an output port, and when the balanced port is used as an input port, the output impedance $Zo$ is preferably smaller than the input impedance $Zi$.

Though the bandpass filter may be constituted by an LC circuit comprising inductance elements and capacitance elements, it is preferably a SAW (surface acoustic wave) filter or FBAR (film bulk acoustic resonator) filter, more preferably those having different input/output impedances.

It is preferable that any one of the first to fourth balanced-unbalanced multiband filter modules is constituted by a laminate comprising pluralities of dielectric layers having electrode patterns, at least part of said phase shifters and said high-frequency switches being constituted by transmission lines formed by said electrode patterns, and said balanced-unbalanced bandpass filters (SAW filters, FBAR filters, etc.) and switching elements constituting said high-frequency switches being mounted onto said laminate. Inductance elements and capacitance elements constituting said phase shifters and/or said high-frequency switches may be formed by electrode patterns on the dielectric layers. In this balanced-unbalanced multiband filter module, other high-frequency parts, such as other high-frequency switches and filters, amplifiers, diplexers, antenna duplexers, etc., may also be formed integrally in said laminate.

The multiband mobile phone of the present invention comprises a high-frequency circuit comprising any one of the first to fourth balanced-unbalanced multiband filter modules.

BEST MODE FOR CARRYING OUT THE INVENTION

Figure 1:
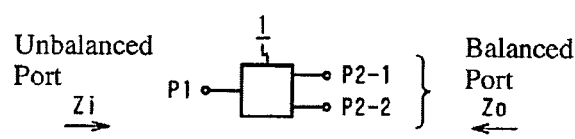
FIG. 1 is a schematic view showing the filter module of the present invention.

The balanced-unbalanced multiband filter module of the present invention, which may be called simply "filter module" hereinafter, comprises as main components high-frequency switches or phase shifters, and balanced-unbalanced bandpass filters having different passbands. Taking a balanced-unbalanced multiband filter module having a three-terminal circuit comprising an unbalanced port P1 and balanced ports P2-1, P2-2 as shown in FIG. 1 for example, detailed explanation will be made below, without intention of restricting the present invention thereto.

[1] FIRST EMBODIMENT

Figure 2:
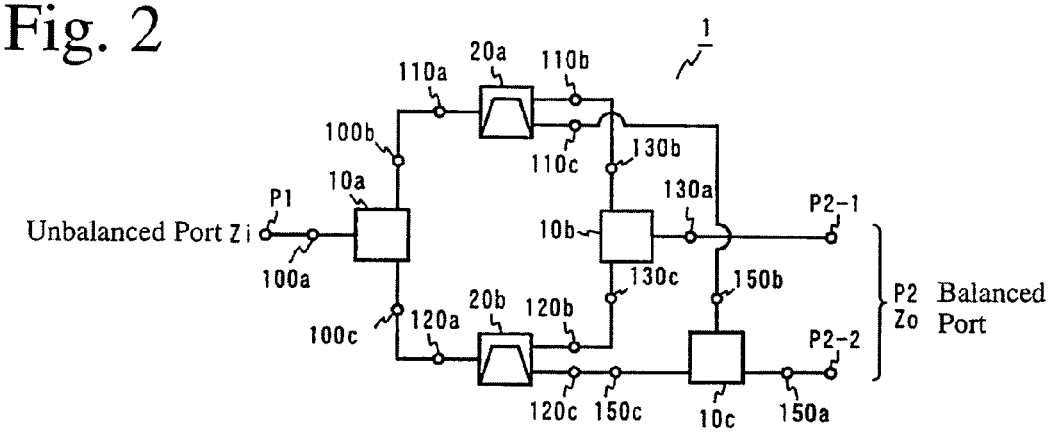
FIG. 2 is a block diagram showing a filter module according to one embodiment of the present invention.

FIG. 2 shows a filter module 1 comprising high-frequency switches and balanced-unbalanced bandpass filters as main components. A first high-frequency switch 10a comprises a first port 100a connected to an unbalanced port P1, a second port 100b connected to an unbalanced port 110a of a first balanced-unbalanced bandpass filter 20a, and a third port 100c connected to an unbalanced port 120a of a second balanced-unbalanced bandpass filter 20b.

The first and second balanced-unbalanced bandpass filters 20a, 20b are connected to a second high-frequency switch 10b and a third high-frequency switch 10c both having three ports.

The second high-frequency switch 10b has a first port 130a connected to a first balanced port P2-1 of the filter module 1, a second port 130b connected to a first balanced port 110b of the first balanced-unbalanced bandpass filter 20a, and a third port 130c connected to a first balanced port 120b of the second balanced-unbalanced bandpass filter 20b. The third high-frequency switch 10c has a first port 150a connected to a second balanced port P2-2 of the filter module 1, a second port 150b connected to a second balanced port 110c of the first balanced-unbalanced bandpass filter 20a, and a third port 150c connected to a second balanced port 120c of the second balanced-unbalanced bandpass filter 20b.

In this embodiment, the bandpass filters 20a, 20b are constituted by balanced-unbalanced SAW filters. The balanced-unbalanced SAW filter has an impedance conversion function and a balance-unbalance conversion function. The adjustment of the crossing width, arrangement and coupling of electrode fingers makes it have different input and output impedances and conduct balance-unbalance conversion.

The second and third ports 130b, 130c, 150b, 150c of the second and third high-frequency switches 10b, 10c connected to the balanced ports 110b, 110c, 120b, 120c of the balanced-unbalanced SAW filters 20a, 20b have substantially the same impedances as those of the balanced ports 110b, 110c, 120b, 120c of the SAW filters 20a, 20b for matching. To adjust the degree of balancing (balance characteristics) of a balanced signal input into or output from the balanced ports of the balanced-unbalanced SAW filters 20a, 20b, an inductance element may be connected between the balanced ports. An FBAR (film bulk acoustic resonator) filter may be used in place of the SAW filter.

FIGS. 6-10 show examples of the equivalent circuits of the first to third high-frequency switches 10a, 10b, and 10c. Though each figure shows a port bearing the reference numeral of the first high-frequency switch 10a as an example, the same is true of the second and third high-frequency switches 10b, 10c.

Figure 6:
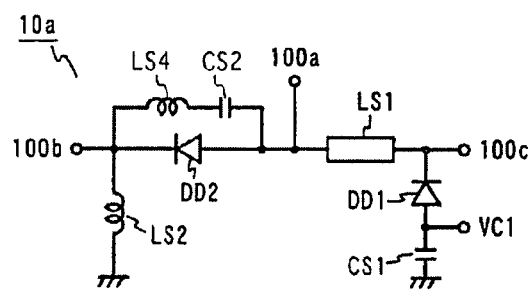
FIG. 6 is a view showing an example of equivalent circuits of high-frequency switches used in the filter module of the present invention.

A switch circuit shown in FIG. 6 is a single-pole-dual-through (SPDT) switch comprising a transmission line and a diode as main components. Specifically, this switch circuit comprises a transmission line LS1 between a port 100a and a port 100c, a diode DD1 and a DC-cutting capacitor CS1 between the transmission line LS1 on the side of the port 100c and a ground, and a control port VC1 between the diode DD1 and the DC-cutting capacitor CS1. The capacitor CS1 constitutes a series resonance circuit with an inductance component during the operation of the diode DD1, so that it is in a short-circuited state during the operation of the diode DD1. This switch circuit further comprises a diode DD2 series-connected to the diode DD1 via the transmission line LS1 between the port 100a and the port 100b, and a high-frequency choke coil LS2 between the port 100b and the ground. The high-frequency choke coil LS2 may be a high-impedance transmission line. The diodes DD1, DD2 are turned on or off by a control voltage supplied from the control port VC1, to switch connection between the port 100a and the port 100b, and between the port 100a and the port 100c. Incidentally, each port 100a, 100b, 100c is properly provided with a DC-cutting capacitor (not shown).

Figure 7:
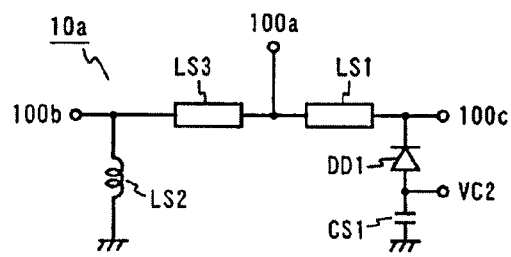
FIG. 7 is a view showing another example of equivalent circuits of high-frequency switches used in the filter module of the present invention.
Figure 8:
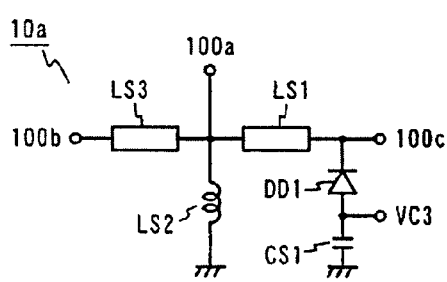
FIG. 8 is a view showing a further example of equivalent circuits of high-frequency switches used in the filter module of the present invention.

FIGS. 7 and 8 show single-pole-single-through (SPST) switches as other switch circuits. The high-frequency switch shown in FIG. 7 is different from the switch circuit shown in FIG. 6 in that the former has a transmission line LS3 in place of the diode DD2 between the port 100a and the port 100b. The transmission line LS3 functioning as a phase shifter adjusts a phase-shifting angle to turn the impedance of the balanced-unbalanced bandpass filter 20a connected to the port 100b into a substantially open state (high impedance) in the passband of the balanced-unbalanced bandpass filter 20b connected to the port 100c. Because this high-frequency switch is constituted by transmission lines and an inductance element or a capacitance element, the diode DD2 can be omitted, resulting in decrease in power consumption in the filter module, and the elimination of the transmission loss of the diode DD2. FIG. 8 shows a modified example of the high-frequency switch shown in FIG. 7, in which the high-frequency choke coil LS2 is disposed on the side of the port 100a of the transmission line LS3. In this high-frequency switch, too, the transmission line LS3 functions as a phase shifter.

Figure 9:
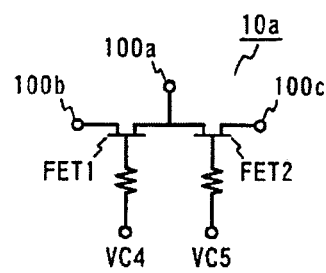
FIG. 9 is a view showing a still further example of equivalent circuits of high-frequency switches used in the filter module of the present invention.
Figure 10:
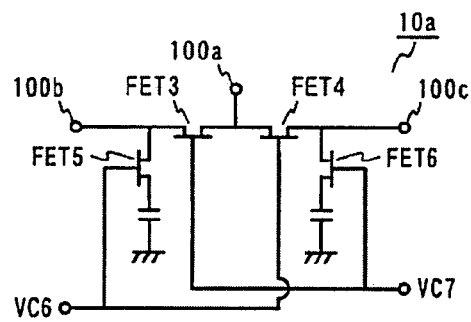
FIG. 10 is a view showing a still further example of equivalent circuits of high-frequency switches used in the filter module of the present invention.

As shown in FIGS. 9 and 10, the switching element in the high-frequency switch may be a GaAs FET. The use of a GaAs FET provides lower power consumption than the diode switch and enables various circuits. For instance, pluralities of GaAs FETs may be series-connected to suppress strain.

In such filter module, the first to third high-frequency switches 10a-10c are properly switched by voltage supplied from each control port depending on high-frequency signals that should pass.

For instance, when the unbalanced port P1 is connected to the balanced ports P2-1, P2-2 via the balanced-unbalanced bandpass filter 20a, connection is made between the ports 100a and 100b of the first high-frequency switch 10a, between the ports 130a and 130b of the second high-frequency switch 10b, and between the ports 150a and 150b of the third high-frequency switch 10c. When the unbalanced port P1 is connected to the balanced ports P2-1, P2-2 via the balanced-unbalanced bandpass filter 20b, connection is made between the ports 100a and 100c of the first high-frequency switch 10a, between the ports 130a and 130c of the second high-frequency switch 10b, and between the ports 150a and 150c of the third high-frequency switch 10c.

With such structure, a high-frequency signal input into the unbalanced port P1 of the filter module is output from the balanced port P2-1, P2-2, and a high-frequency signal input into the balanced port P2-1, P2-2 is output from the unbalanced port P1.

In this embodiment, excellent isolation characteristics are obtained between the bandpass filters 20a, 20b by each high-frequency switch 10a, 10b, 10c, thereby substantially preventing the high-frequency signal from leaking to the other circuit.

[2] SECOND EMBODIMENT

Figure 3:
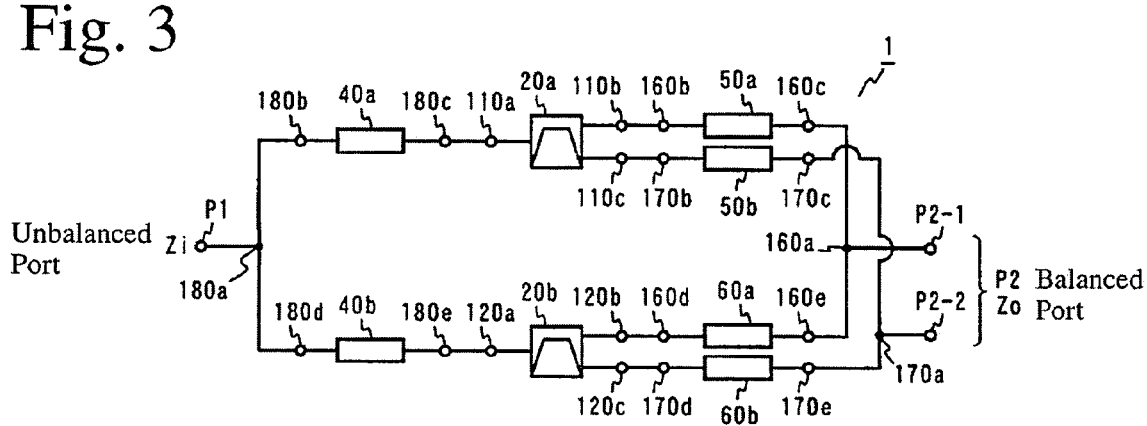
FIG. 3 is a block diagram showing a filter module according to another embodiment of the present invention.

FIG. 3 shows a filter module 1 according to the second embodiment of the present invention. This filter module comprises phase shifters and balanced-unbalanced bandpass filters as main components.

An unbalanced port P1 of the filter module is connected to a first port 180b of a first phase shifter 40a and a first port 180d of a second phase shifter 40b, a second port 180c of the first phase shifter 40a is connected to an unbalanced port 110a of a first balanced-unbalanced bandpass filter 20a, and a second port 180e of the second phase shifter 40b is connected to an unbalanced port 120a of a second balanced-unbalanced bandpass filter 20b.

A third phase shifter 50a has a first port 160b connected to a first balanced port 110b of the first balanced-unbalanced bandpass filter 20a, and a second port 160c connected to a first balanced port P2-1 of the filter module.

A fourth phase shifter 50b has a first port 170b connected to a second balanced port 110c of the first balanced-unbalanced bandpass filter 20a, and a second port 170c connected to a second balanced port P2-2 of the filter module.

A fifth phase shifter 60a has a first port 160d connected to a first balanced port 120b of the second balanced-unbalanced bandpass filter 20a, and a second port 160e connected to the first balanced port P2-1 of the filter module.

A sixth phase shifter 60b has a first port 170d connected to a second balanced port 120c of the second balanced-unbalanced bandpass filter 20a, and a second port 170e connected to the second balanced port P2-2 of the filter module.

Each phase shifter can be constituted by a transmission line and a filter to adjust a phase-shifting angle, so that the impedance of a circuit including the balanced-unbalanced bandpass filter is substantially open (high impedance).

As described above, the first, third and fourth phase shifters are connected to the first balanced-unbalanced bandpass filter to provide high impedance in the passband of the second balanced-unbalanced bandpass filter, and the second, fifth and sixth phase shifters are connected to the second bandpass filter to provide high impedance in the passband of the first balanced-unbalanced bandpass filter, thereby dividing the high-frequency signals, so that a high-frequency signal input into the unbalanced port P1 of the filter module is output from the balanced port P2-1, P2-2, or a high-frequency signal input into the balanced port P2-1, P2-2 is output from the unbalanced port P1.

Because switching elements are not needed in this embodiment, power consumption can be reduced when the filter module is used for mobile phones.

[3] THIRD EMBODIMENT

Figure 4:
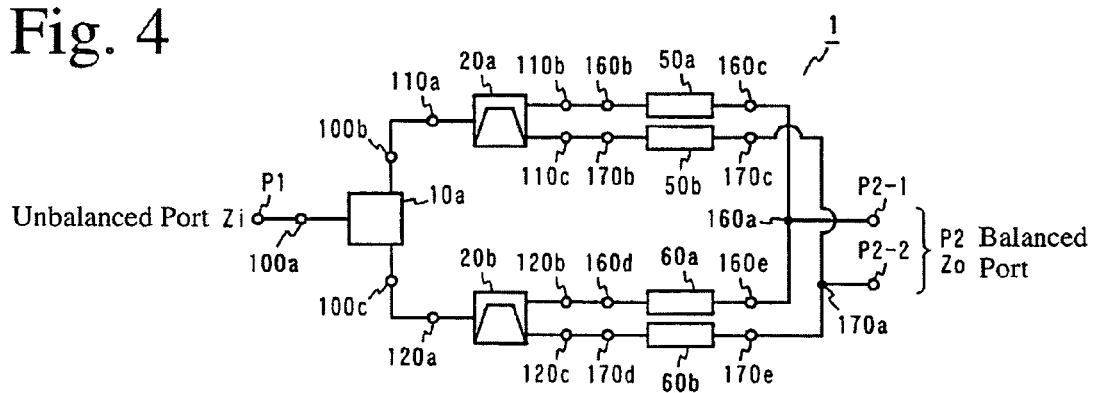
FIG. 4 is a block diagram showing a filter module according to a further embodiment of the present invention.

A filter module 1 according to the third embodiment of the present invention, which is shown in FIG. 4, comprises a high-frequency switch comprising a switching element, balanced-unbalanced bandpass filters having different passbands, and phase shifters connected to the balanced-unbalanced bandpass filters as main components.

The filter module 1 has an unbalanced port P1 connected to a first port 100a of a first high-frequency switch 10a, a second port 100b connected to an unbalanced port 110a of a first balanced-unbalanced bandpass filter 20a, and a third port 100c connected to an unbalanced port 120a of a second balanced-unbalanced bandpass filter 20b.

A first phase shifter 50a has a first port 160b connected to a first balanced port 110b of the first balanced-unbalanced bandpass filter 20a, and a second port 160c connected to a first balanced port P2-1 of the filter module 1.

A second phase shifter 50b has a first port 170b connected to a second balanced port 110c of the first balanced-unbalanced bandpass filter 20a, and a second port 170c connected to a second balanced port P2-2 of the filter module 1.

A third phase shifter 60a has a first port 160d connected to a first balanced port 120b of the second balanced-unbalanced bandpass filter 20b, and a second port 160e connected to the first balanced port P2-1 of the filter module 1.

A fourth phase shifter 60b has a first port 170d connected to a second balanced port 120c of the second balanced-unbalanced bandpass filter 20b, and a second port 170e connected to the second balanced port P2-2 of the filter module.

The first and second phase shifters 50a, 50b are connected to the first balanced-unbalanced bandpass filter 20a to provide high impedance in the passband of the second balanced-unbalanced bandpass filter 20b, and the third and fourth phase shifters 60a, 60b are connected to the second balanced-unbalanced bandpass filter 20b to provide high impedance in the passband of the first balanced-unbalanced bandpass filter 20a, so that the first high-frequency switch 10a is switched depending on the high-frequency signals that should pass. As a result, a high-frequency signal input into the unbalanced port P1 of the filter module 1 is output from the balanced port P2-1, P2-2, and a high-frequency signal input into the balanced port P2-1, P2-2 is output from the unbalanced port P1.

Because each circuit element has the same function as in the above embodiments, its explanation will be omitted. In this embodiment, too, because isolation is secured between the bandpass filters by the high-frequency switches and the phase shifters, it is possible to substantially prevent the leak of a high-frequency signal from the other circuit.

[4] FOURTH EMBODIMENT

Figure 5:
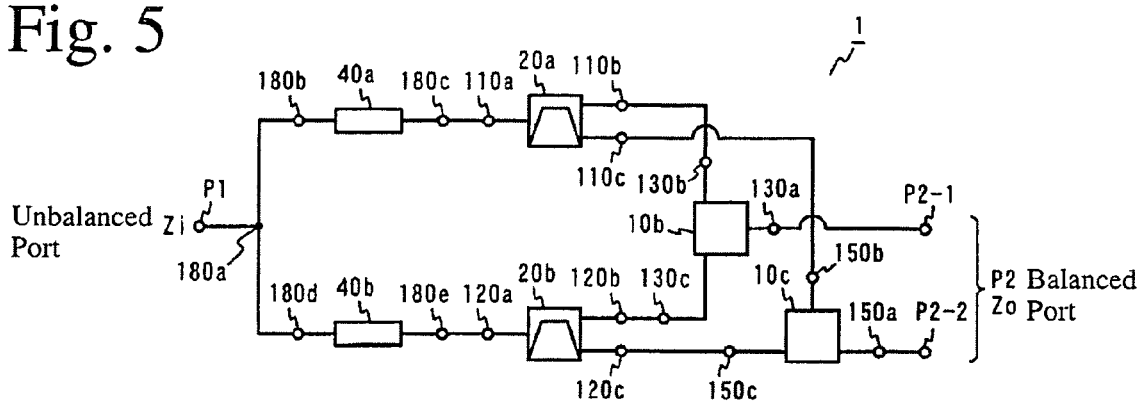
FIG. 5 is a block diagram showing a filter module according to a still further embodiment of the present invention.

A filter module 1 according to the fourth embodiment of the present invention, which is shown in FIG. 5, also comprises pluralities of high-frequency switches comprising switching elements, balanced-unbalanced bandpass filters having different passbands, and phase shifters connected to the balanced-unbalanced bandpass filters as main components, as in the third embodiment.

An unbalanced port P1 of the filter module 1 is connected to a first port 180b of a first phase shifter 40a and a first port 180d of a second phase shifter 40b, a second port 180c of the first phase shifter 40a is connected to an unbalanced port 110a of a first balanced-unbalanced bandpass filter 20a, and a second port 180e of the second phase shifter 40b is connected to an unbalanced port 120a of a second balanced-unbalanced bandpass filter 20b. The first and second balanced-unbalanced bandpass filters 20a, 20b are connected to the first and second high-frequency switches 10b, 10c both having three ports.

The first high-frequency switch has a first port 130a connected to a first balanced port P2-1 of the filter module, a second port 130b connected to a first balanced port 110b of the first balanced-unbalanced bandpass filter 20a, and a third port 130c connected to a first balanced port 120b of the second balanced-unbalanced bandpass filter 20b.

The second high-frequency switch has a first port 150a connected to a second balanced port P2-2 of the filter module, a second port 150b connected to a second balanced port 110c of the first balanced-unbalanced bandpass filter 20a, and a third port 150c connected to a second balanced port 120c of the second balanced-unbalanced bandpass filter 20b.

The first phase shifter 40a is connected to the first balanced-unbalanced bandpass filter 20a to provide high impedance in the passband of the second balanced-unbalanced bandpass filter 20b, and the second phase shifter 40b is connected to the second balanced-unbalanced bandpass filter 20b to provide high impedance in the passband of the first balanced-unbalanced bandpass filter 20a, so that the first and second high-frequency switches 10b, 10c are switched depending on the high-frequency signals that should pass. As a result, a high-frequency signal input into the unbalanced port P1 of the filter module 1 is output from the balanced port P2-1, P2-2, and a high-frequency signal input into the balanced port P2-1, P2-2 is output from the unbalanced port P1.

Because each circuit element has the same function as in the above embodiments, its explanation will be omitted. In this embodiment, too, because isolation can be secured between the bandpass filters by the high-frequency switches, it is possible to substantially prevent the leak of a high-frequency signal from the other circuit.

[5] FIFTH EMBODIMENT

Figure 11A:
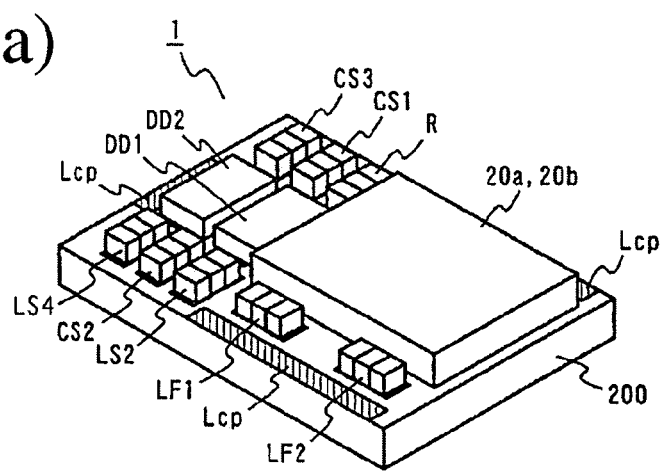
FIG. 11(a) is a perspective view showing a top surface of a filter module according to one embodiment of the present invention.
Figure 11B:
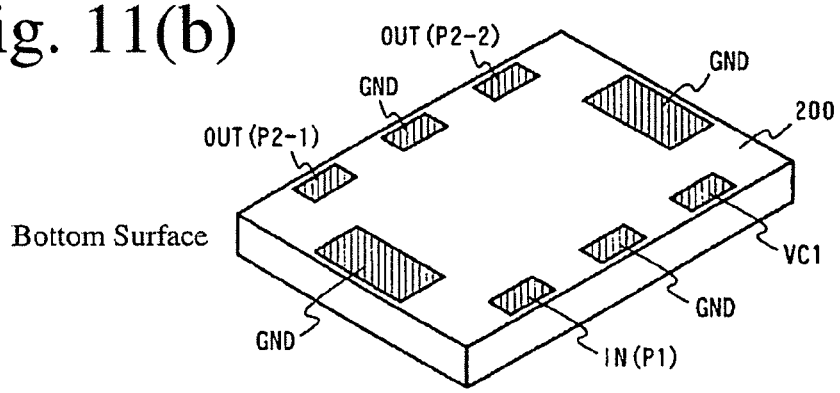
FIG. 11(b) is a perspective view showing a bottom surface of a filter module according to one embodiment of the present invention.
Figure 12:
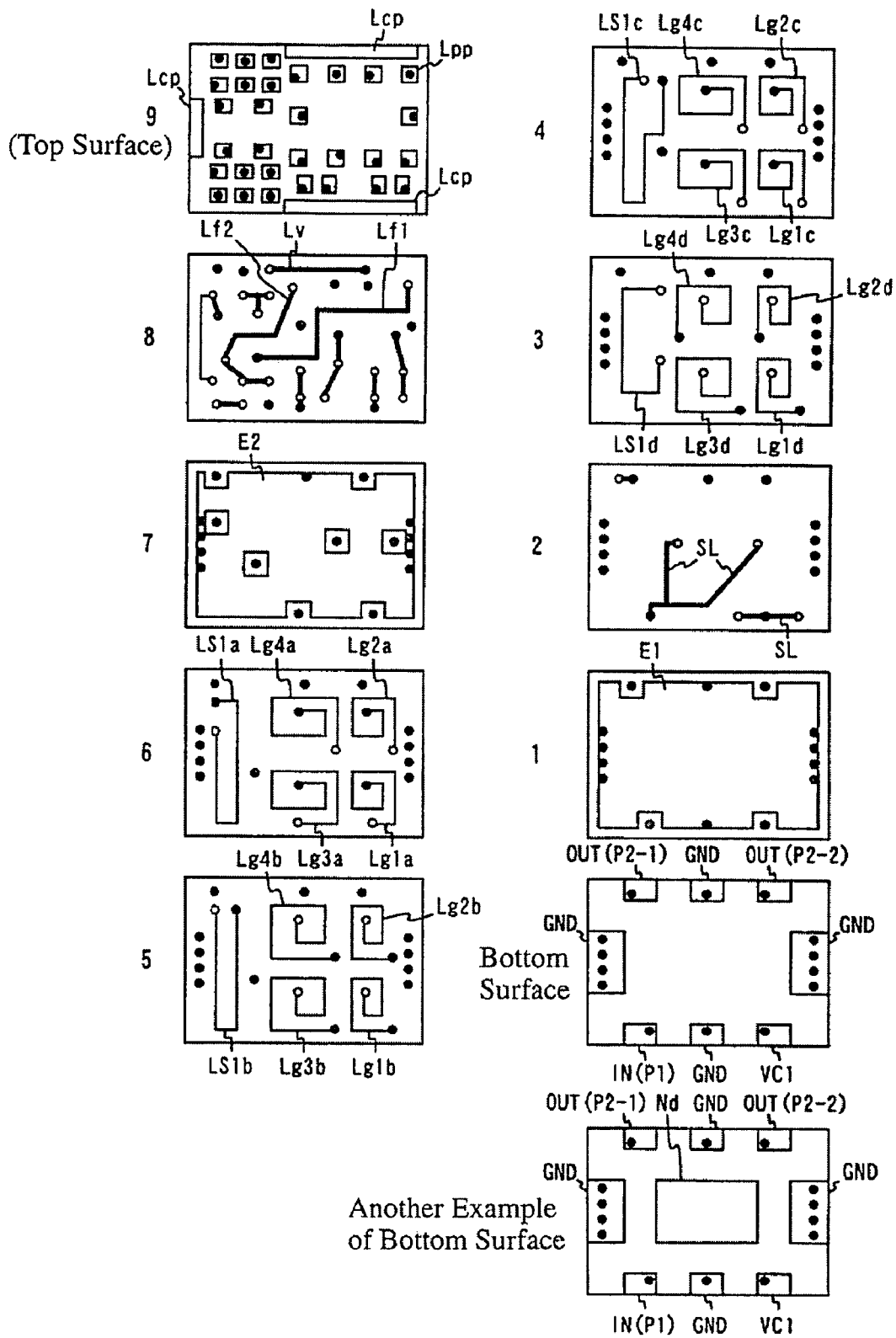
FIG. 12 is a development of laminate substrates constituting a filter module according to one embodiment of the present invention.

The filter module 1 in the third embodiment (FIG. 4) is formed by laminating pluralities of ceramic layers to provide a high-frequency part. FIGS. 11(a) and (b) show the top and bottom surfaces of the high-frequency part, FIG. 12 shows the structure of each layer in a laminate 200 constituting the filter module 1, and FIG. 13 shows the equivalent circuit of the filter module 1.

Figure 13:
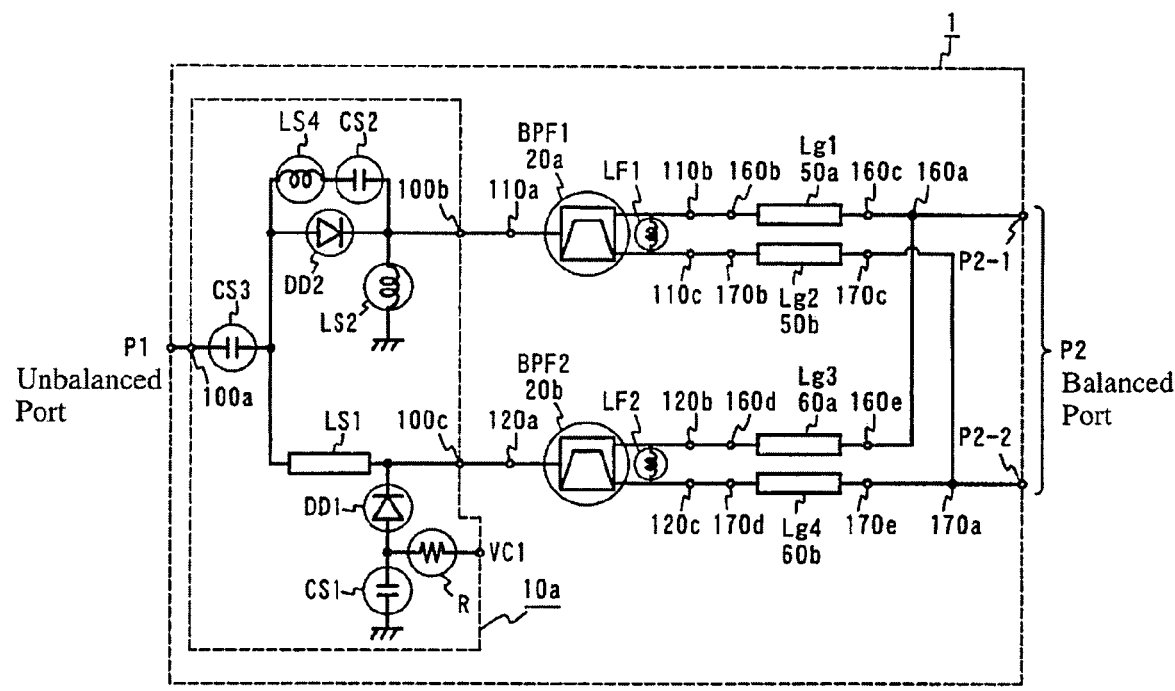
FIG. 13 is a view showing an equivalent circuit of a filter module according to one embodiment of the present invention.

In the filter module 1 in this embodiment, as shown by the equivalent circuit of FIG. 13, a switching element in the first high-frequency switch 10a is a diode switch comprising a Pin diode. The diode switch comprises a transmission line and diodes as main components. Specifically, it comprises a transmission line LS1 between the connection points 100a and 100c, which is formed in the laminate 200, a diode DD1 and a capacitor CS1 between the transmission line LS1 on the side of the connection point 100c and a ground, and a control port VC1 between the diode DD1 and the capacitor CS1. The capacitor CS1 constitutes a DC resonance circuit with an inductance component appearing when the diode DD1 is operated, so that it is in a short-circuited state during the operation of the diode DD1.

A diode DD2 series-connected to the diode DD1 via the transmission line LS1 is disposed between the connection point 100a and the connection point 100b, and a high-frequency choke coil LS2 is disposed between the connection point 100b and the ground. To improve isolation characteristics while the diode DD2 is turned off, the diode DD2 is connected in parallel to an inductor LS4, to which a capacitor CS2 is connected in series. The high-frequency choke coil LS2 may be constituted by a chip inductor or a high-impedance transmission line. The diodes DD1, DD2 are turned on or off by a control voltage supplied from the control port VC1, so that connection is switched between the connection point 100a and the connection point 100b, and between the connection point 100a and the connection point 100c. A DC-cutting capacitor CS3 is disposed on the side of the connection point 100a. A DC-cutting capacitor may be properly disposed for impedance matching, etc. on the side of the connection points 100b, 100c depending on the types of the bandpass filters, but it is not necessary when a SAW filter is used as the bandpass filter, because there is no DC connection between the input and the output. In this embodiment, circuit elements other than the transmission line LS1 are mounted as chip parts onto a land Lpp on a top surface of the laminate substrate.

In this embodiment, surface-mounted, unbalanced-input-balanced-output SAW filters are used as the first and second balanced-unbalanced bandpass filters 20a, 20b. Inductance elements LF1, LF2 are connected between the balanced output terminals P2-1, P2-2, such that the degree of balancing is in a range of 180°±10°. The SAW filter may be mounted as a bare chip onto a top surface of the laminate 200, or mounted onto a bottom surface of a cavity formed in the laminate 200 and sealed by a resin. The phase shifters 50a, 50b, 60a, 60b connected to the balanced output terminals of the unbalanced-input-balanced-output SAW filters are constituted by transmission lines Lg1, Lg2, Lg3, Lg4 formed in the laminate 200. The inductance elements and the capacitance elements, etc. may, of course, properly be formed by electrode patterns on the laminate substrate.

A magnetic metal cap of plated SPCC, etc. (not shown) is disposed on a main surface of the laminate 200, onto which chip parts are mounted, such that it covers chip parts. A resin sealant may be used in place of the metal cap. The preferred resin sealant is a liquid resin sealant properly comprising an epoxy resin, a liquid curing agent such as an amine, a catalyst or acid anhydride, a material for adjusting its coefficient of linear expansion to about 5-8 ppm, a material for adjusting modulus, etc.

The laminate 200 may be made of, for instance, dielectric ceramic materials sinterable at as low temperatures as 1000° C. or lower, and produced by printing a conductive paste of a low-resistivity material such as Ag, Cu, etc. on a green sheet having a thickness of 10-200 μm to form a predetermined electrode pattern, and integrally laminating pluralities of green sheets and sintering them.

The dielectric materials may be, for instance, materials comprising Al, Si, Sr, etc. as main components, and Ti, Bi, Cu, Mn, Na, K, etc. as auxiliary components; materials comprising Al, Si, Sr, etc. as main components, and Ca, Pb, Na, K, etc. as auxiliary components, materials comprising Al, Mg, Si, Gd, etc., or materials comprising Al, Si, Zr, Mg, etc. The dielectric materials preferably have dielectric constants of about 5-15. In addition to the dielectric ceramic materials, resin substrates, composite substrates of resins and dielectric ceramic powders may be used. Using an HTCC (high-temperature cofired ceramic) technology, transmission lines, etc. may be formed by high-melting-point metals such as tungsten, molybdenum, etc. on $Al_2O_3$ ceramic substrates.

As shown in FIG. 12, a lowermost green sheet 1 in the laminate 200 has a top surface provided with a wide-area ground electrode E1, and a bottom surface provided with terminal electrodes that are mounted onto a circuit substrate. The terminal electrodes comprise an unbalanced input port IN (P1), balanced output ports OUT (P2-1, P2-2), a ground port, and a control port VC1 for controlling the switch circuit, which are connected through via-holes (shown by black circles in the figure) formed on the green sheets. The figure shows the arrangement of the terminals when viewed from the bottom surface, which is upside down when viewed from the top surface. Though the terminal electrodes are in LGA (land grid array) in this embodiment, they may be in BGA (ball grid array), etc. When sufficient connection strength to the circuit substrate is not secured, one or more auxiliary terminal electrodes Nd may be formed on the same plane as the terminal electrodes to have stronger connection to the circuit substrate.

On a green sheet 2 laminated on the green sheet 1, pluralities of connecting lines SL are formed to connect the phase shifters Lg1, Lg3 to the phase shifters Lg2, Lg4. With these connecting lines SL connecting the phase shifters Lg1, Lg2, Lg3, Lg4, the lines SL and the via-holes become slightly longer. It may thus be said that the connecting lines SL and the via-holes partly constitute the phase shifters.

Formed on a green sheet 3 laminated on the green sheet 2 are transmission lines Lg1d, Lg2d, Lg3d, Lg4d constituting the phase shifters Lg1, Lg2, Lg3, Lg4, a transmission line LS1d constituting the first switch 10a together with via-holes. Though the transmission lines Lg1d, Lg2d, Lg3d, Lg4d constituting the phase shifters and the transmission line LS1d constituting the first high-frequency switch 10a are spiral, they may be meandering if there is enough area. The transmission lines Lg1d-Lg4d constituting the phase shifters are connected to the transmission line SL formed on the green sheet 2 through the via-holes.

Formed on a green sheet 4 laminated on the green sheet 3 are transmission lines Lg1c, Lg2c, Lg3c, Lg4c constituting the phase shifters Lg1, Lg2, Lg3, Lg4, and a transmission line LS1c constituting the first switch 10a together with via-holes. The transmission lines Lg1c-Lg4c constituting the phase shifters and the transmission line LS1c constituting the first switch 10a are connected to the transmission lines Lg1d, Lg2d, Lg3d, Lg4d formed on the green sheet 3 and the transmission line LS1d constituting the first switch 10a through the via-holes. Formed on green sheets 5, 6 laminated on the green sheet 4 are transmission lines Lg1b-Lg4b, Lg1a-Lg4a constituting the phase shifters Lg1, Lg2, Lg3, Lg4 and transmission lines LS1b, LS1a constituting the first switch 10a, which are connected through the via-holes.

A wide-area ground electrode E2 is formed on a green sheet 7 laminated on the green sheet 6. The ground electrode E2 is connected to a ground electrode E1 through the via-hole, sandwiching the transmission lines for LS1 constituting the phase shifters Lg1, Lg2, Lg3, Lg4 and the transmission lines for LS1 constituting the first switch 10a, to make electromagnetic interference as small as possible. The transmission lines constituting the phase shifters Lg1, Lg2, Lg3, Lg4 and the transmission lines for LS1 constituting the first switch 10a are arranged such that they do not overlap in a lamination direction to prevent mutual interference. In the connection of the transmission lines constituting the phase shifters Lg1, Lg2, Lg3, Lg4, even if the connecting line SL partially overlaps the line electrodes on the green sheet 3, for instance, their overlap is inclined to prevent interference.

Formed on a green sheet 8 laminated on the green sheet 7 are lines for connecting circuit elements such as chip parts, transmission lines, etc. A connecting line Lv extends from the control terminal VC1 to the resistor R. A ground electrode E2 prevents interference between the transmission lines constituting the phase shifters on the green sheet 6 and the connecting lines on the green sheet 8. With the ground electrode E2 arranged near the connecting line Lv, the malfunction of the first switch 10a is not likely to occur even if voltage from the control power supply varies.

Connecting lines Lf1, Lf2 connect the first switch 10a to the first and second bandpass filters 20a, 20b. The connecting lines Lf1, Lf2 enable impedance matching between the first switch 10a and the first and second the bandpass filters 20a, 20b.

A green sheet 9 laminated on the green sheet 8 has pluralities of land electrodes Lpp for mounting chip parts, which are connected to connecting lines and circuit elements formed in the laminate 200 through the via-holes. The laminate 200 is provided along two long sides and one short side of a main surface with lands Lcp, to which a metal casing is fixed. Switching elements (diodes, FETs, etc.) and SAW filters mounted onto the land electrodes Lpp are in a bare state, though they may be sealed with a resin or a tube.

As described above, the filter module can be made small by forming into a laminate. Of course, other switches, amplifiers, etc. can be mounted to the laminate substrate. Though the unbalanced-input-balanced-output filter module has been explained in the above embodiments for the purpose of simplification, a balanced-input-unbalanced-output filter module having a terminal P1 as an unbalanced output terminal, and terminals P2 as balanced input terminals is also, of course, within the scope of the present invention.

The filter module in this embodiment can select passing high-frequency signals (for instance, GSM850 and GSM900) by voltage supplied from a control circuit connected to the port VC1 of the first high-frequency switch. For instance, when the first balanced-unbalanced bandpass filter is operable for GSM850, and when the second balanced-unbalanced bandpass filter is operable for GSM900, the first high-frequency switch connected to the control circuit is controlled as shown in Table 1, to change each mode. Because isolation can be achieved between the bandpass filters by the high-frequency switches and the phase shifters, it is possible to substantially prevent the leak of a high-frequency signal from the other circuit.

TABLE 1

| Mode | VC1 |
| --- | --- |
| GSM850 | ON |
| GSM900 | OFF |

[6] SIXTH EMBODIMENT

Figure 14:
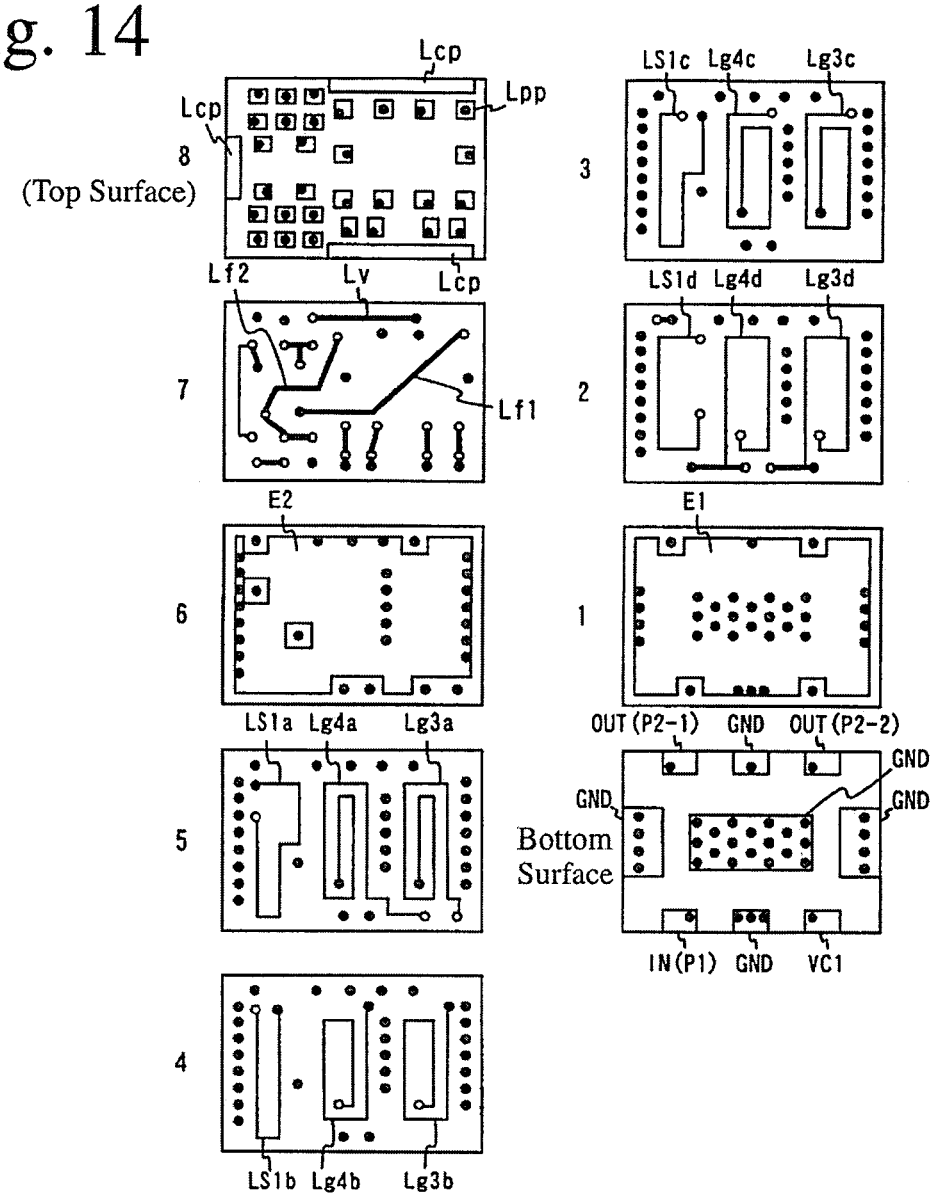
FIG. 14 is a development of laminate substrates constituting a filter module according to another embodiment of the present invention.

FIG. 14 shows each layer in another laminate 200 constituting the filter module 1 in the third embodiment (FIG. 4). Because the equivalent circuit and appearance of this filter module are substantially the same as in the fifth embodiment, their explanation will be omitted. The explanation of the laminate in this embodiment will be focused on differences from the fifth embodiment.

Figure 19A:
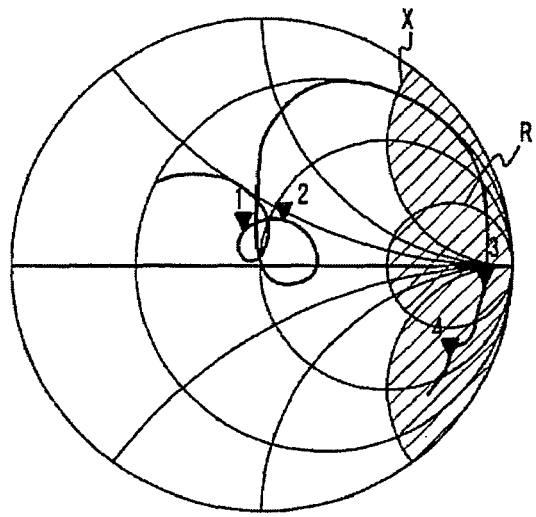
FIG. 19(a) is a Smith chart showing impedance characteristics of a bandpass filter when viewed from the balanced port.
Figure 19B:
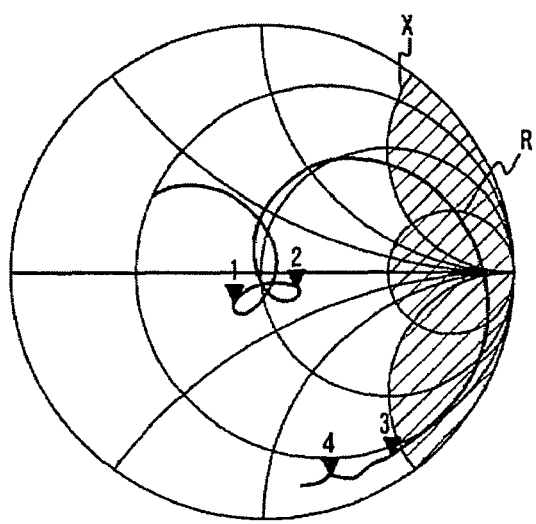
FIG. 19(b) is a Smith chart showing impedance characteristics of a bandpass filter when viewed from the unbalanced port.
Figure 20:
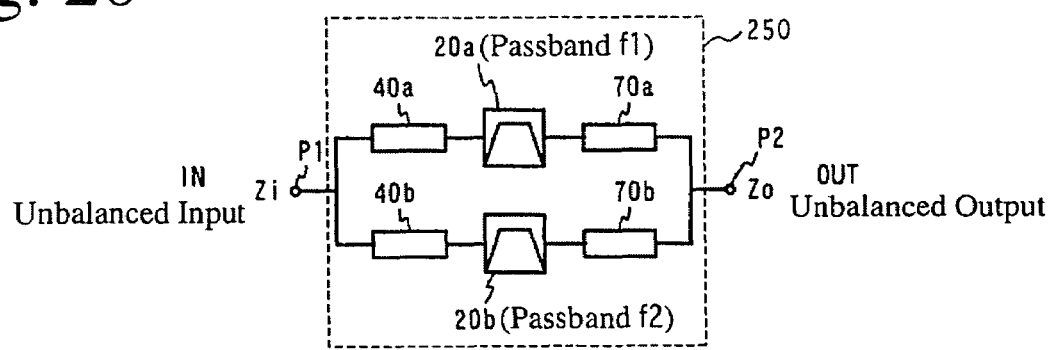
FIG. 20 is a block diagram showing a conventional two-frequency diplexer circuit.
Figure 21:
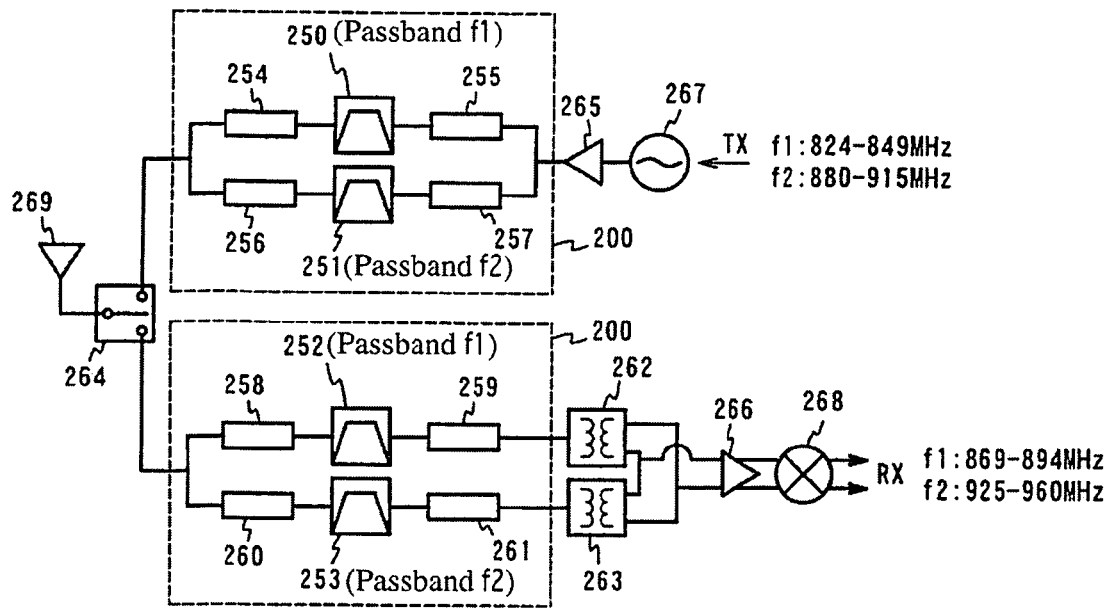
FIG. 21 is a block diagram showing a high-frequency circuit for multiband mobile phones comprising a conventional two-frequency diplexer circuit.
Figure 22:
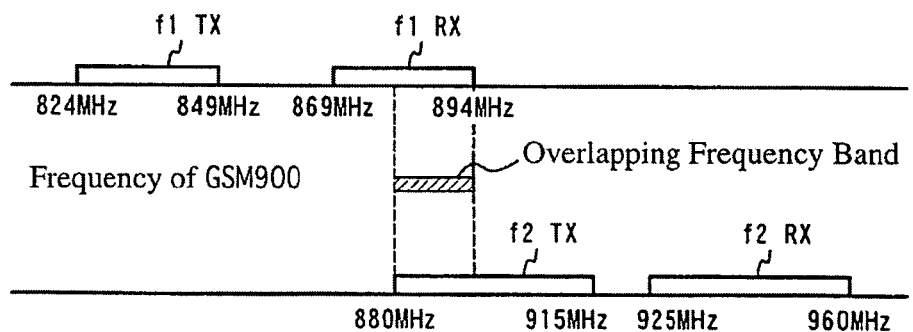
FIG. 22 is a view showing transmitting/receiving frequencies in GSM850 and GSM900.

In this embodiment, a SAW filter having impedance characteristics shown in FIGS. 19(a) and 19(b) is used as the first balanced-unbalanced bandpass filter. As described above, the impedance of the balanced port of this SAW filter is substantially 50 Ω in a receiving frequency band of GSM850, while it is substantially in an open range (high impedance) in a receiving frequency band of GSM900. Accordingly, the transmission lines Lg1a-d, Lg2a-d constituting the phase shifters Lg1, Lg2 are not needed unlike in the fifth embodiment, so that the first balanced-unbalanced bandpass filter is connected to the balanced ports OUT (P2-1, P2-2) via the connecting lines and the via-holes.

Though a phase changes by increase in the line length by the connecting lines and the via-holes as described above, the impedance characteristics do not substantially change in this embodiment because of extremely small increase in the line length, whereby the impedance is substantially in an open range in a receiving frequency band of GSM900. Accordingly, the filter module in this embodiment exhibits the same function as in the fifth embodiment.

The auxiliary terminal electrode Nd formed on the same plane as the terminal electrodes is connected to the ground electrode E1 (on the green sheet 1) through the via-hole. With the auxiliary terminal electrode Nd used as a ground electrode, the ground electrode E1 can have a uniform ground potential, and the auxiliary terminal electrode Nd can have improved adhesion strength to the laminate substrate.

In this embodiment, too, it is possible to substantially prevent the leak of a high-frequency signal from the other circuit, because isolation is secured between the bandpass filters by the high-frequency switches and the phase shifters.

[7] SEVENTH EMBODIMENT

Figure 15:
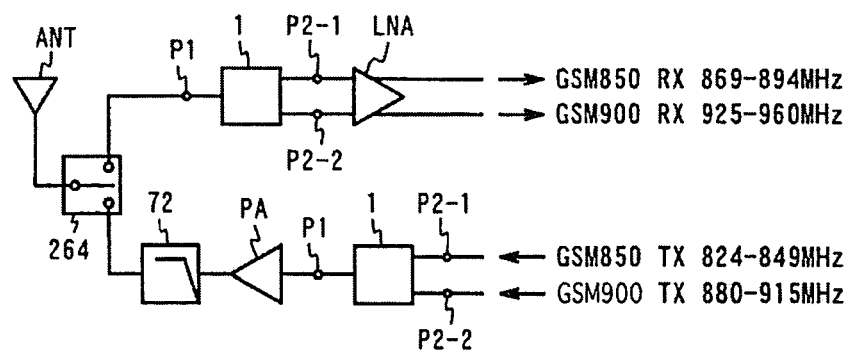
FIG. 15 is a block diagram showing a high-frequency circuit for multiband mobile phones, which comprises a filter module according to one embodiment of the present invention.

This embodiment is concerned with the use of a filter module in a multiband mobile phone. FIG. 15 shows a high-frequency circuit for dual-band mobile phones. Here, two communications systems of GSM850 and GSM900 are uses as an example.

A high-frequency switch 264 for switching the connection of an antenna ANT to transmitting circuits and receiving circuits has a receiving port, to which the unbalanced port P1 of the filter module 1 of the present invention is connected. The balanced ports P2-1, P2-2 of the filter module 1 are connected to the balanced ports of a low-noise amplifier LNA. A transmitting port of the high-frequency switch 264 is connected to the unbalanced port P1 of the filter module 1 of the present invention via a lowpass filter 72 and a high-frequency amplifier PA. For instance, known GaAs switches, diode switches, etc, may be used for the high-frequency switch 264, and known π-filters. etc. may be used for the lowpass filter 72.

The high-frequency circuit constituted as in this embodiment does not need a balun, resulting in the reduction of battery consumption in mobile phones. Also, the filter module 1 having at least one high-frequency switch can extremely reduce the leak of a high-frequency signal by isolation characteristics owned by the high-frequency switch, even when different communications systems with extremely close frequency bands such as GSM850 and GSM900 are used. As a result, the communications quality of multiband mobile phones is not deteriorated.

Though the filter module 1 of the present invention is disposed on both transmitting and receiving sides of the high-frequency circuit in this embodiment, its arrangement on either one of the transmitting and receiving sides is of course within the scope of the present invention.

[8] EIGHTH EMBODIMENT

Figure 16:
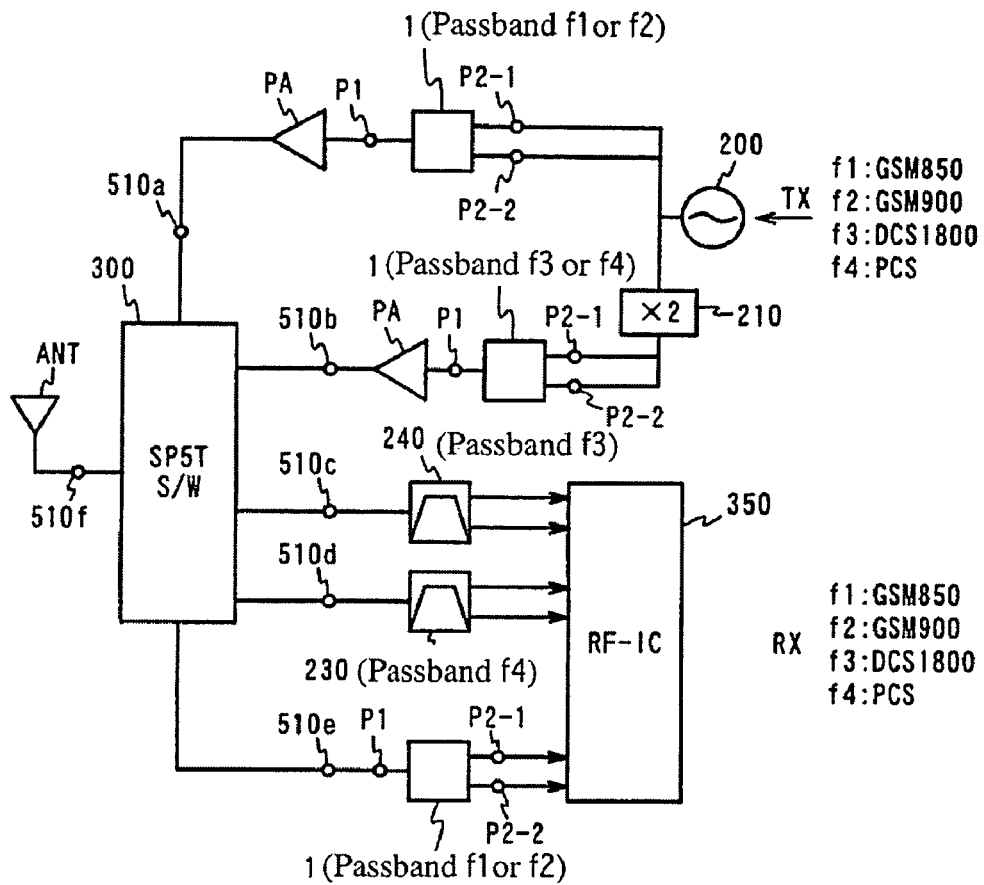
FIG. 16 is a block diagram showing a high-frequency circuit for multiband mobile phones, which comprises a filter module according to another embodiment of the present invention.

As a further example of using the filter module of the present invention for a multiband mobile phone, FIG. 16 shows the high-frequency circuit of the multiband mobile phone, which comprises pluralities of filter modules. This high-frequency circuit can be used for four communications systems of different transmitting/receiving frequencies, GSM850, GSM900, DCS1800 and PCS, as shown in Table 2.

TABLE 2

| Communications Systems | Transmitting Signal Frequency Tx | Receiving Signal Frequency Rx |
| --- | --- | --- |
| GSM850 | 824–849 MHz | 869–894 MHz |
| GSM900 | 880–915 MHz | 925–960 MHz |
| DCS1800 | 1710–1785 MHz | 1805–1880 MHz |
| PCS | 1850–1910 MHz | 1930–1990 MHz |

An SP5T switch 300 comprises six input/output terminals; a port 510$f$ connected to an antenna ANT, a port 510$a$ for inputting the transmitting signals of GSM850 and GSM900, a port 510$b$ for inputting the transmitting signals of DCS1800 and PCS, a port 510$e$ for outputting the receiving signals of GSM850 and GSM900, a port 510$c$ for outputting the receiving signal of DCS1800, and a port 510$d$ for outputting the receiving signal of PCS.

Figure 17:
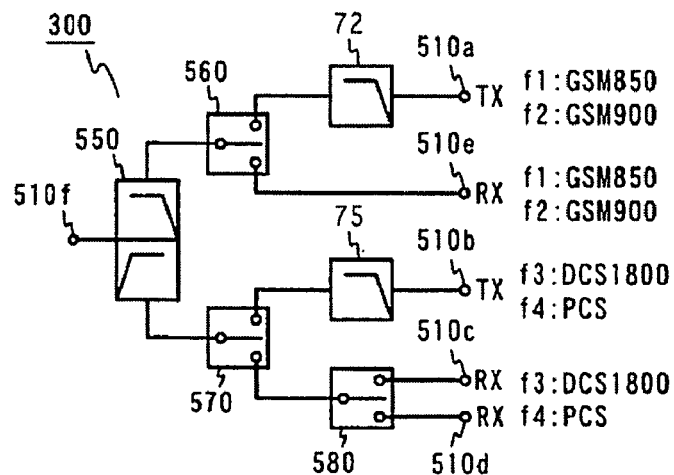
FIG. 17 is a block diagram showing an SP5T switch used in the multiband mobile phone.

FIG. 17 shows a circuit block of an SP5T switch. A port 510$f$ is connected to a diplexer circuit 550 comprising a lowpass filter for passing the high-frequency signals of GSM850 and GSM900, and a highpass filter for passing the high-frequency signals of DCS1800 and PCS. The diplexer circuit 550 may be a multiplexer for dividing high-frequency signals to 2 or more constituted by a proper combination of bandpass filters, lowpass filters, highpass filters, SAW filters, etc. each comprising inductance elements and capacitance elements as main components.

The lowpass filter in the diplexer circuit 550 is connected to a high-frequency switch 560 for switching connection between the transmitting circuits and receiving circuits of GSM850 and GSM900. The highpass filter in the diplexer circuit 550 is connected to a high-frequency switch 570 for switching connection between the transmitting circuits and receiving circuits of DCS1800 and PCS. The high-frequency switches 560, 570 are connected to lowpass filters 72, 75 on the transmitting circuit side. The high-frequency switch 570 is connected to a GaAs switch 580 on the receiving circuit side to switch the receiving circuit of DCS1800 and the receiving circuit of PCS.

Figure 18:
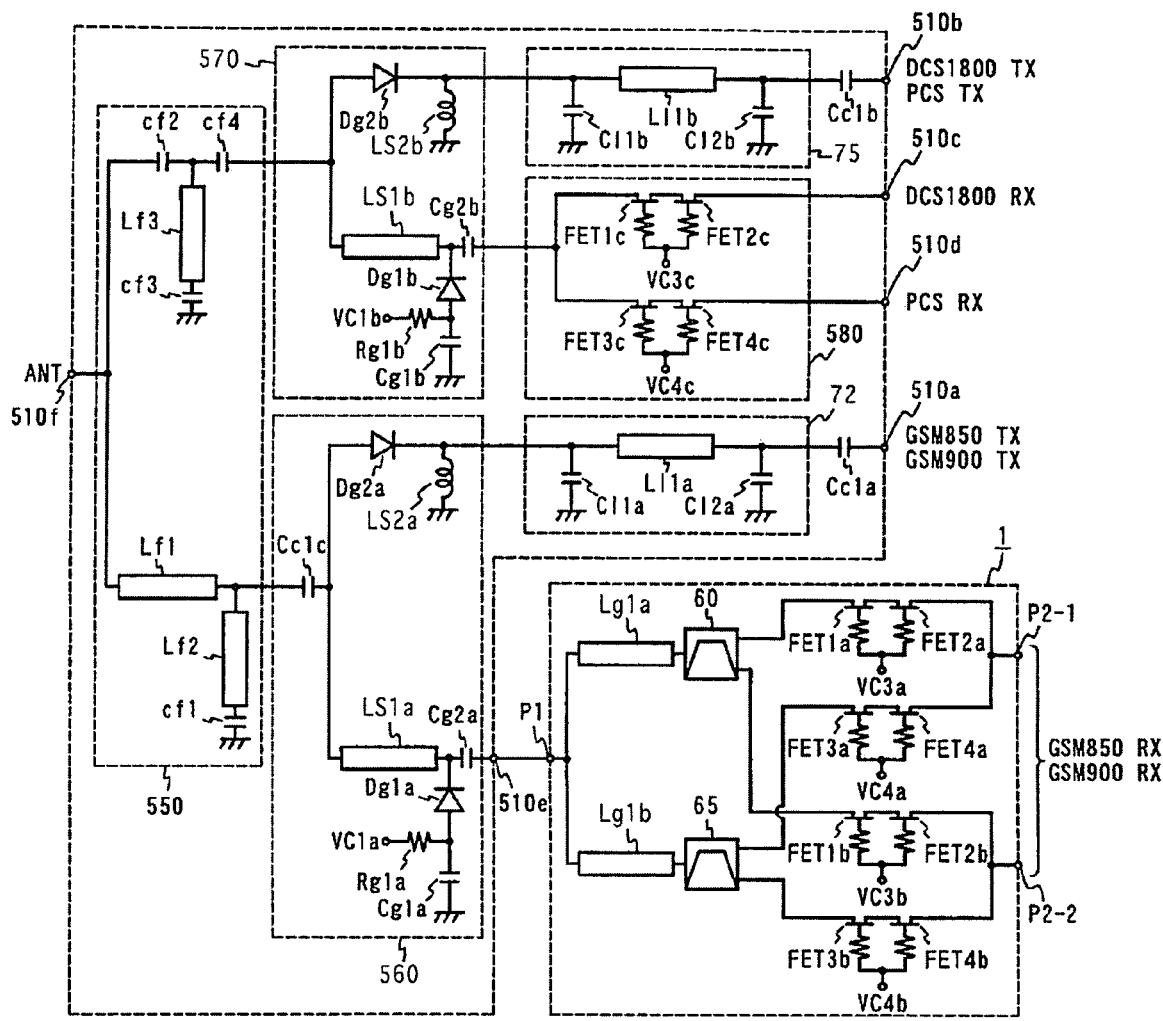
FIG. 18 is a view showing an equivalent circuit of a high-frequency circuit for multiband mobile phones, which comprises a filter module according to one embodiment of the present invention.

FIG. 18 shows an equivalent circuit when the port 510$e$ of the SP5T switch 300 having such structure is connected to the filter module 1. The filter module 1 is the same as the circuit shown in FIG. 5, comprising the first and second phase shifters Lg1$a$, Lg1$b$, the first and second balanced-unbalanced bandpass filters 60, 65, the first high-frequency switch comprising four switching elements FET1$a$-FET4$a$, and the second high-frequency switch comprising four switching elements FET1$b$-FET4$b$.

The mode of the filter module in this embodiment is switched by a control voltage supplied from the control circuit connected to each control port, as shown in Table 3.

TABLE 3

| Mode | VC1a | VC1b | VC3a | VC3b | VC3c | VC4a | VC4b | VC4c |
| --- | --- | --- | --- | --- | --- | --- | --- | --- |
| GSM850 TX | ON | OFF | OFF | OFF | OFF | OFF | OFF | OFF |
| GSM850 RX | OFF | OFF | ON | ON | OFF | OFF | OFF | OFF |
| GSM900 TX | ON | OFF | OFF | OFF | OFF | OFF | OFF | OFF |
| GSM900 RX | OFF | OFF | OFF | OFF | OFF | ON | ON | OFF |
| DCS1800 TX | OFF | ON | OFF | OFF | OFF | OFF | OFF | OFF |
| DCS1800 RX | OFF | OFF | OFF | OFF | ON | OFF | OFF | OFF |
| PCS TX | OFF | ON | OFF | OFF | OFF | OFF | OFF | OFF |
| PCS RX | OFF | OFF | OFF | OFF | OFF | OFF | OFF | ON |

In the case of transmitting GSM900 in this embodiment, even though part of the high-frequency signal from an amplifier PA is leaked to the terminal 510$e$ via the switch 560, the leaked high-frequency signal is cut by the filter module 1, thereby preventing it from flowing into RF-IC350 comprising a low-noise amplifier. The receiving signal of GSM850 or GSM900 from the antenna ANT is deprived of spurious components (noises) such as sideband waves, etc. by the bandpass filter, and input into RF-IC350 as an impedance-changed balanced signal. Accordingly, the communications quality of mobile phones is not deteriorated.

The equivalent circuit shown in FIG. 18 can function as a high-frequency circuit for triple-band mobile phones of GSM850/GSM900/DCS1800, etc., except for a high-frequency switch 0580. Also, in place of the high-frequency switch 580, the filter module 1 can be connected.

APPLICABILITY IN INDUSTRY

The balanced-unbalanced multiband filter module of the present invention suppresses increase in insertion loss, and in communications or access systems utilizing extremely close frequency bands, it permits high-frequency signals in the operating communications or access systems to pass while cutting high-frequency signals in the other communications or access system. When the balanced-unbalanced multiband filter module of the present invention is used for high-frequency communications appliances such as multiband mobile phones, etc., it undergoes low battery consumption with little deterioration in communications quality, and can reduce the number of parts in their high-frequency circuits.

What is claimed is:

1. A balanced-unbalanced multiband filter module comprising a high-frequency antenna switch for switching the connection of an antenna to a transmitting circuit and the connection of said antenna and a receiving circuit and usable in a multiband mobile phone for the pluralities of communications systems using close frequency bands, said balanced-unbalanced multiband filter module comprising three high-frequency switches each comprising a switching element, and two balanced-unbalanced bandpass filters having different transmitting frequency bands, a first high-frequency switch comprising a first port connected to an unbalanced port of said module, a second port connected to an unbalanced port of the first balanced-unbalanced bandpass filter, and a third port connected to an unbalanced port of a second balanced-unbalanced bandpass filter;

a second high-frequency switch comprising a first port connected to the first balanced port of said module, a second port connected to the first balanced port of the first balanced-unbalanced bandpass filter, and a third port connected to the first balanced port of the second balanced-unbalanced bandpass filter; and a third high-frequency switch comprising a first port connected to the second balanced port of said module, a second port connected to the second balanced port of the first balanced-unbalanced bandpass filter, and a third port connected to the second balanced port of the second balanced-unbalanced bandpass filter; and being disposed on a transmitting side and/or a receiving side of said high-frequency circuit, on said transmitting side, an unbalanced port of said balanced-unbalanced multiband filter module being connected to a high-frequency amplifier connected to a transmitting port of said high-frequency antenna switch, on said receiving side, an unbalance port of said balanced-unbalanced multiband filter module being connected to a receiving port of said high-frequency antenna switch, and said first and second balanced ports of said module being connected to the balanced ports of said filter module connected to a low-noise amplifier, said first to third high-frequency switches being switched depending on a passing high-frequency signal, whereby a high-frequency signal of the first or second communication system input into an unbalanced port of said module is output to said low-noise amplifier from the first and second balanced ports, and a high-frequency signal of the first or second communication system input into said first and second balanced ports is output to said high-frequency amplifier from an unbalanced port of said module.

2. A balanced-unbalanced multiband filter module comprising a high-frequency antenna switch for switching the connection of an antenna to a transmitting circuit and the connection of said antenna and a receiving circuit and usable in a multiband mobile phone for the pluralities of communications systems using close frequency bands, said balanced-unbalanced multiband filter module comprising two balanced-unbalanced bandpass filters having different transmitting frequency bands, and six phase shifters connected to said balanced-unbalanced bandpass filter, a first phase shifter comprising a first port connected to an unbalanced port of said module, and a second port connected to an unbalanced port of the first balanced-unbalanced bandpass filter;

a second phase shifter comprising a first port connected to an unbalanced port of said module, and a second port connected to an unbalanced port of the second balanced-unbalanced bandpass filter;

a third phase shifter comprising a first port connected to the first balanced port of the first balanced-unbalanced bandpass filter, and a second port connected to the first balanced port of said module;

a fourth phase shifter comprising a first port connected to the second balanced port of the first balanced-unbalanced bandpass filter, and a second port connected to the second balanced port of said module;

a fifth phase shifter comprising a first port connected to the first balanced port of the second balanced-unbalanced bandpass filter, and a second port connected to the first balanced port of said module; and a sixth phase shifter comprising a first port connected to the second balanced port of the second balanced-unbalanced bandpass filter, and a second port connected to the second balanced port of said module;

whereby a high-frequency signal of The first or second communication system input into an unbalanced port of said module is output to said low-noise amplifier from said first and second balanced ports, or a high-frequency signal input of the first or second communication system into said first and second balanced ports is output to said high-frequency amplifier from an unbalanced port of said module.

3. A balanced-unbalanced multiband filter module comprising a high-frequency antenna switch for switching the connection of an antenna to a transmitting circuit and the connection of said antenna and a receiving circuit and usable in a multiband mobile phone for pluralities of communications systems using close frequency bands, said balanced-unbalanced multiband filter module comprising a high-frequency switch comprising switching element, two balanced-unbalanced bandpass filters having different transmitting frequency bands, and four phase shifters connected to said balanced-unbalanced bandpass filters, said high-frequency switch comprising a first port connected to an unbalanced port of said module, a second port connected to an unbalanced port of the first balanced-unbalanced bandpass filter, and a third port connected to an unbalanced port of the second balanced-unbalanced bandpass filter;

a first phase shifter comprising a first port connected to the first balanced port of the first balanced-unbalanced bandpass filter, and the second port connected to the first balanced port of said module;

a second phase shifter comprising a first port connected to the second balanced port of the first balanced-unbalanced bandpass filter, and a second port connected to the second balanced port of said module;

a third phase shifter comprising a first port connected to the first balanced port of the second balanced-unbalanced bandpass filter, and a second port connected to the first balanced port of said module; and a fourth phase shifter comprising a first port connected to the second balanced port of the second balanced-unbalanced bandpass filter, and a second port connected to the second balanced port of said module;

said first high-frequency switch being switched depending on a passing high-frequency signal, whereby a high-frequency signal input of the first or second communication system into an unbalanced port of said module is output to said low-noise amplifier from the first and second balanced ports, or a high-frequency signal of the first or second communication system input in to said first and second balanced ports is output to said high-frequency amplifier from an unbalanced port of said module.

4. A balanced-unbalanced multiband filter module comprising a high-frequency antenna switch for switching the connection of an antenna to transmitting circuit and the connection of said antenna and a receiving circuit and usable in a multiband mobile phone for the pluralities of communications systems using close frequency bands, said balanced-unbalanced multiband filter module comprising two high-frequency switches each comprising a switching element, two balanced-unbalanced bandpass filters having different transmitting frequency bands, and two phase shifters connected to said balanced-unbalanced bandpass filter, a first phase shifter comprising a first port connected to an unbalanced port of said module, and a second port connected to an unbalanced port of the first balanced-unbalanced bandpass filter;

a second phase shifter comprising a first port connected to an unbalanced port of said module, and a second port connected to an unbalanced port of the second balanced-unbalanced bandpass filter;

a first high-frequency switch comprising a first port connected to the first balanced port of said module, a second port connected to the first balanced port of the first balanced-unbalanced bandpass filter, and a third port connected to the first balanced port of the second balanced-unbalanced bandpass filter;

a second high-frequency switch comprising a first port connected to the second balanced port of said module, a second port connected to the second balanced port of the first balanced-unbalanced bandpass filter, and a third port connected to the second balanced port of the second balanced-unbalanced bandpass filter;

said first and second high-frequency switches being switched depending on a passing high-frequency signal, whereby a high-frequency signal input of the first or second communication system into an unbalanced port of said module is output to said low-noise amplifier from the first and second balanced ports, or a high-frequency signal of the first or second communication system input into said first and second balanced ports is output to said high-frequency amplifier from an unbalanced port of said module.

5. A multiband mobile phone comprising a high-frequency circuit having the balanced-unbalanced multiband filter module recited in claim 1.

6. The balanced-unbalanced multiband filter module according to any one of claims 1-4, wherein said balanced-unbalanced bandpass filter is a SAW filter or an FBAR filter.

7. The balanced-unbalanced multiband filter module according to claim 6, wherein it is constituted by a laminate of pluralities of dielectric layers having electrode patterns, not only said balanced-unbalanced bandpass filters being mounted onto a main surface of said laminate of pluralities of dielectric layers but also switching elements being mounted onto said main surface of said laminate, and terminal electrodes for the first and second ports being formed on one side of a bottom surface of said laminate of pluralities of dielectric layers and a terminal electrode for the unbalanced port being formed on an opposite side of said bottom surface thereof.

8. The balanced-unbalanced multiband filter module according to claim 6, wherein it is constituted by a laminate of pluralities of dielectric layers having electrode patterns, not only said balanced-unbalanced bandpass filters being mounted onto a main surface of said laminate of pluralities of dielectric layers but also transmission lines constituting said phase shifters being formed by said electrode patterns, and terminal electrodes for the first and second ports being formed on one side of a bottom surface of said laminate of pluralities of dielectric layers, and a terminal electrode for the unbalanced port being formed on an opposite side of said bottom surface thereof.

9. The balanced-unbalanced multiband filter module according to any one of claims 1-4, wherein said first and second balanced-unbalanced bandpass filters have different input impedance Zi and output impedance Zo, thereby exhibiting an impedance conversion function.

10. The balanced-unbalanced multiband filter module according to claim 9, wherein said balanced-unbalanced bandpass filter is a SAW filter or an FBAR filter.

11. The balanced-unbalanced multiband filter module according to claim 9, wherein it is constituted by a laminate of pluralities of dielectric layers having electrode patterns, not only said balanced-unbalanced bandpass filters being mounted onto a main surface of said laminate of pluralities of dielectric layers but also switching elements being mounted onto said main surface of said laminate, and terminal electrodes for the first and second ports being formed on one side of a bottom surface of said laminate of pluralities of dielectric layers and a terminal electrode for the unbalanced port being formed on an opposite side of said bottom surface thereof.

12. The balanced-unbalanced multiband filter module according to claim 9, wherein it is constituted by a laminate of pluralities of dielectric layers having electrode patterns, not only said balanced-unbalanced bandpass filters being mounted onto a main surface of said laminate of pluralities of dielectric layers but also transmission lines constituting said phase shifters being formed by said electrode patterns, and terminal electrodes for the first and second ports being formed on one side of a bottom surface of said laminate of pluralities of dielectric layers, and a terminal electrode for the unbalanced port being formed on an opposite side of said bottom surface thereof.

13. The balanced-unbalanced multiband filter module according to any one of claims 1 and 3, wherein it is constituted by a laminate of pluralities of dielectric layers having electrode patterns, not only said balanced-unbalanced bandpass filters being mounted onto a main surface of said laminate of pluralities of dielectric layers but also switching elements being mounted onto said main surface of said laminate, and terminal electrodes for the first and second ports being formed on one side of a bottom surface of said laminate of pluralities of dielectric layers and a terminal electrode for the unbalanced port being formed on an opposite side of said bottom surface thereof.

14. The balanced-unbalanced multiband filler module according to any one of claims 2 and 4, wherein it is constituted by a laminate of pluralities of dielectric layers having electrode patterns, not only said balanced-unbalanced bandpass filters being mounted onto a main surface of said laminate of pluralities of dielectric layers but also transmission lines constituting said phase shifters being formed by said electrode patterns, and terminal electrodes for the first and second ports being formed on one side of a bottom surface of said laminate of pluralities of dielectric layers, and a terminal electrode for the unbalanced port being formed on an opposite side of said bottom surface thereof.

* * * * *